United States Patent [19]
Burckhardt et al.

[11] Patent Number: 4,543,526
[45] Date of Patent: Sep. 24, 1985

[54] CAPACITIVE DEVICE FOR THE MEASUREMENT OF DISPLACEMENTS

[75] Inventors: Christophe W. Burckhardt, Renens; Jacques Fournier, Ecublens; Philippe Stauber, Lausanne, all of Switzerland

[73] Assignee: Tesa S.A., Vaud, Switzerland

[21] Appl. No.: 508,898

[22] Filed: Jun. 28, 1983

[30] Foreign Application Priority Data

Jul. 7, 1982 [CH] Switzerland .................. 4133/82

[51] Int. Cl.[4] ............................................ G01R 27/26
[52] U.S. Cl. ............................ 324/61 R; 340/870.37
[58] Field of Search ............ 324/61 R, 61 P, DIG. 1; 340/870.37; 318/662

[56] References Cited

U.S. PATENT DOCUMENTS

| | | | |
|---|---|---|---|
| 3,777,257 | 12/1973 | Geisselmann | 324/61 R |
| 3,873,916 | 3/1975 | Sterki | 324/61 R |
| 3,938,113 | 2/1976 | Dobson et al. | 340/870.37 |
| 4,350,981 | 9/1982 | Tanaka et al. | 340/870.37 |
| 4,420,754 | 12/1983 | Anderma | 324/61 R |

Primary Examiner—Stanley T. Krawczewicz
Assistant Examiner—Jack B. Harvey
Attorney, Agent, or Firm—Anthony J. Casella; Gerald E. Hespos

[57] ABSTRACT

The device comprises a scale (1) and a slide (2) which are provided with electrodes arranged to form two pairs of capacitances for the measurement of the displacement of the slide on the scale ($CA_1$–$CA_2$, $CB_1$–$CB_2$). These measurement capacitances are connected to an electronic feed and processing circuit (3) in which they are connected in a bridge (4A, 4B) with switched reference capacitances of MOS type. In this circuit, the outputs of these bridges are connected via comparators (5A, 5B) to a processor (6) of CMOS type adapted to produce a terminal digital measurement signal by counting the periods of the signal of the measurement capacitances and by numerical interpolation within each of these periods. This interpolation is effected by balancing the capacitive bridges by means of a digital algorithm.

11 Claims, 7 Drawing Figures

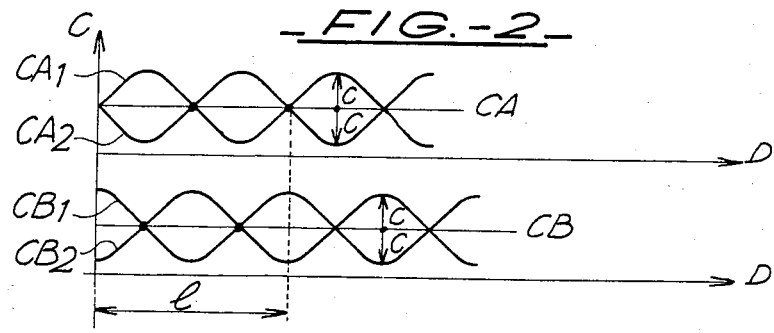
FIG.-2-
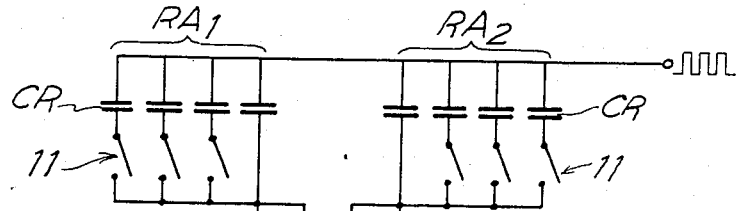
FIG.-3-
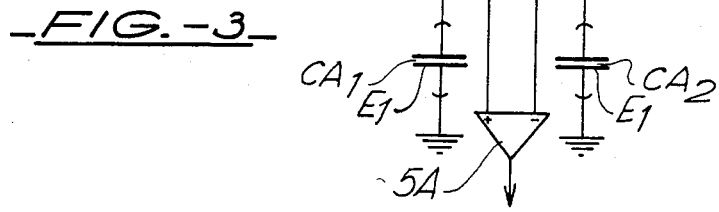
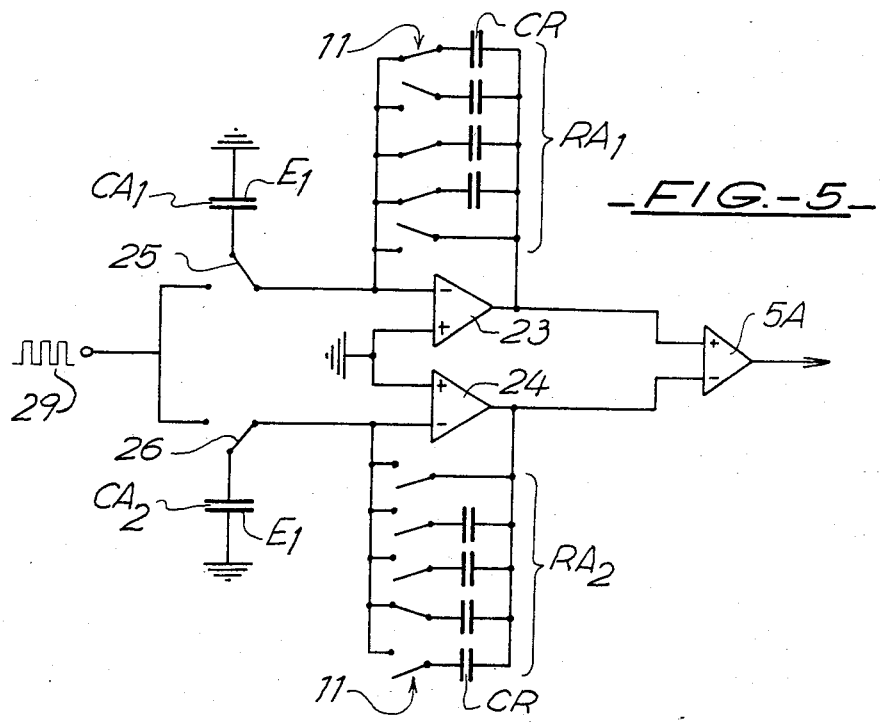
FIG.-5-

CAPACITIVE DEVICE FOR THE MEASUREMENT OF DISPLACEMENTS

The object of the present invention is a capacitive device for the measurement of the relative displacement of the scale and the slide of a length- or angle-measuring instrument and more precisely, but not exclusively, of an instrument for manual use, such as, for instance, a slide caliper, a column or an angle indicator.

This device is of the known type in which the scale and the slide are provided with series of electrodes which are aligned in the direction of their relative displacement and which are arranged and fed electrically in such a manner as by their combination to form a plurality of electrical capacitances adapted to produce a periodic signal the number of periods of which is proportional to the displacement and in which the electrodes of the slide are connected to an electronic processing circuit adapted to elaborate an end-of-measurement digital signal of said displacement by counting the number of these periods and interpolating within each of them.

A capacitive measuring device of this type is described in the French patent application published under U.S. Pat. No. 2,411,391. In that device, the scale is provided with a series of electrodes which are spaced uniformly apart and insulated electrically from each other, each composed of two galvanic coupling elements one of which constitutes a detection electrode and the other a transfer electrode, while the slide is provided with at least three groups of feed electrodes, each connected to an output of a generator of at least three signals to receive voltages presenting a cyclic configuration as well as with at least one reception electrode connected to the electronic signal processing circuit.

In this electrode arrangement, the detection electrodes of the scale are located facing the path of the feed electrodes of the slide while the transfer electrodes of the scale are located facing the path of the reception electrode of the slide. In this way the displacement of the slide on the scale causes the appearance on the reception electrode of a signal which is produced from at least two signals corresponding to two adjacent feed electrodes, and the identification of the amplitude ratio of the signals which is effected by the electronic circuit makes it possible to determine the position of the slide with respect to the scale.

This known device has the essential advantage of avoiding between the scale and the slide any connection either by cable or by sliding contact, which might hamper use or maintenance.

However, this capacitive measuring device, which is also designed with its simplicity and economy in mind, contains circuits which are still relatively complicated and for the most part of an analog nature and which necessarily include an analog-digital converter to obtain a digital display of the measurement effected and therefore are still of relatively high consumption of energy.

The object of the invention is greater simplicity of the electronic processing circuit and the ability to consume less energy than the aforesaid device. This in order, in particular, to permit the use of cells or batteries of small capacitance and therefore small volume in order to reduce to a minimum the dimensions of the housing containing the feed and processing circuits while retaining a long period of use without replacement of cells or recharging of the batteries.

For this purpose the capacitive measuring device of the invention is characterized by the fact that the electrodes of the scale are spaced uniformly apart in the direction of its length, by the fact that at least a part of the electrodes of the slide are distributed in two groups each comprising at least one pair of electrodes in which the two electrodes are insulated from each other, arranged above the region of the electrodes of the scale and fed by a digital signal generator, these two electrodes being furthermore 180° out of phase and the two groups of electrodes being 90° out of phase so as to form, by their association with the electrodes of the scale, two pairs of measurement capacitances against ground, the course of the signals of which is indicative of the amplitude and the direction of said displacement, by the fact that the electronic processing circuit comprises two groups of switched reference capacitances of MOS type of binary order mounted in a bridge with the measurement capacitances so as to form two capacitive bridges, two comparators each connected to one of these two bridges, and a processor of CMOS type with two inputs which are connected to said two comparators and two retroactive outputs connected to the two capacitive bridges and whose circuit comprises modules adapted to effect a numerical interpolation within each period by periodically reestablishing, under control of the digital signal generator, the balance of the capacitive bridges by switching the reference capacitances, the position of the switches of these capacitances indicating, upon each balancing, the digital equivalent of the displacement, the counting of the periods being possibly furthermore effected between these balancing operations by the intervention of a pulse generator.

In this way the method of processing the analog signals coming from the two pairs of measurement capacitances is entirely digital. This is fully in accord with the purpose of simplicity and economy in energy at which the invention is directed, the analog portion of the electronic circuit being limited to the capacitive bridges which, furthermore, are energized only when a measurement is being effected during the displacement of the slide on the scale.

The accompanying drawing shows by way of example one embodiment of the object of the invention as well as three variants.

FIG. 2 is a graph showing the course of the signals produced.

FIG. 3 is a diagram of an element of the electronic circuit.

FIGS. 5, 6 and 7 are diagrams of three variants.

Figure 1:
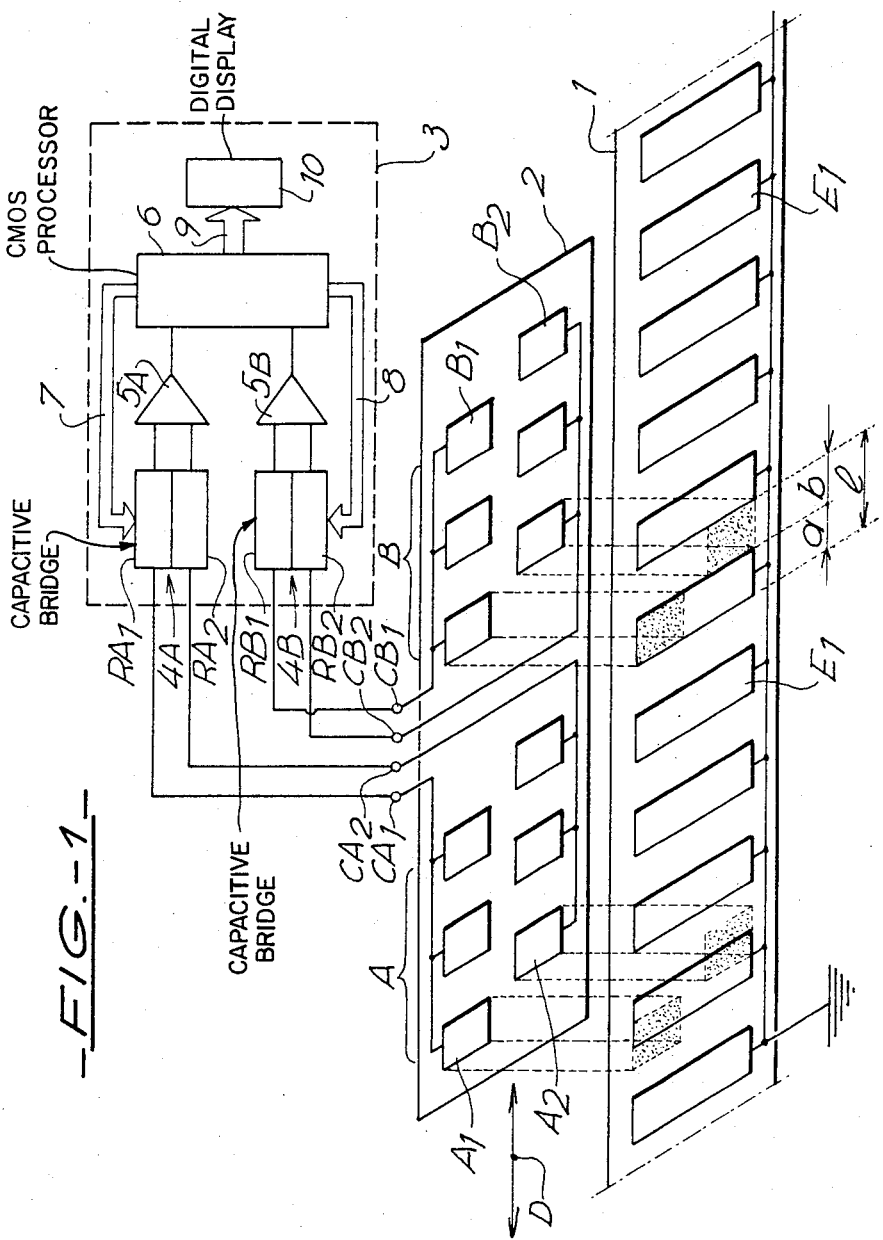
FIG. 1 is an overall diagram of the embodiment given by way of example.

The capacitive measuring device shown diagrammatically as a whole in FIG. 1 is composed of a scale 1, in this case linear, such as, for instance, the bar of a slide caliper; a slide 2 mounted for movement and sliding in customary manner along the scale 1, such as, for instance, the slide of a slide caliper; and an electronic feed and processing circuit 3 which may be integrated in a housing integral with the slide 2.

The scale 1 is provided with a series of electrodes $E_1$ spaced uniformly apart in the direction of its length and all connected to ground. These electrodes are rectangular and the space b between every two of them is equal to their width a. In this way, this scale constitutes a linear measurement standard having a periodic repetition of a basic conductive element formed by an electrode $E_1$ the period 1 of which is equal to the sum of the width a of this electrode and the space b which separates it from the next electrode in accordance with the relationship $1=a+b$.

The slide 2 is provided with two groups of electrodes A and B each having a given number of pairs of electrodes $A_1-B_1$ and $A_2-B_2$ respectively, here three in number. These two groups of electrodes A and B are spaced apart in the longitudinal direction of the scale 1 and the two electrodes $A_1$ and $A_2$ and $B_1$ and $B_2$ respectively of each pair are insulated from each other and spaced apart in the transverse direction of the scale and each is connected to a digital signal generator which is integrated in the electronic circuit 3.

The electrodes $A_1$, $A_2$, $B_1$ and $B_2$ of the slide 2 are of the same width a and at the same distance b apart from each other within each group A and B as the electrodes $E_1$ of the scale; however, in the transverse direction they are arranged in such a manner as to cover the region occupied by the electrodes $E_1$, the ones $A_1$ and $B_1$ on the one side and the others $A_2$ and $B_2$ on the other side.

Within each group of electrodes A and B the two electrodes of each pair are 180° out of phase and these two groups of electrodes are 90° out of phase, as is indicated in the drawing by the orthogonal projection in dashed lines of one pair of electrodes in each group A and B onto the electrodes $E_1$ of the scale 1.

Distributed in this manner, the electrodes of the scale 1 and the slide 2 form two pairs of measurement capacitances with respect to ground, $CA_1-CA_2$ and $CB_1-CB_2$, respectively, the signals of which change as a function of the relative displacement D between said scale and the slide and in accordance with the said phase shifts of their electrodes in the manner shown in the graph of FIG. 2.

In this graph, the displacements D are plotted on the abscissa and the variations in amplitude C of the signals produced by the capacitances $CA_1$ and $CA_2$ and $CB_1$ and $CB_2$ respectively are plotted on the ordinate.

Setting CA and CB equal to the average of the signals emitted by the capacitances $CA_1$ and $CA_2$ and $CB_1$ and $CB_2$ respectively during the displacement and setting C equal to the variation of the amplitude of these signals within a period, it is seen that these signals change in the following manner:

$$CA_1 = CA \pm C$$

$$CA_2 = CA \mp C$$

and $$CB_1 = CB \pm C$$

$$CB_2 = CB \mp C$$

The amplitude C being related to the relative displacement of the scale and the slide within a period, it is thus possible to determine the relative position of these two elements by combining two measurement components, namely:

(1) A rough position determined by count up and/or count down of the number of periods, the two pairs of capacitances $CA_1-CA_2$ and $CB_1-CB_2$, as a result of their phase shift of 90° between them, making it possible to determine the direction of displacement.

(2) A fine position determined by interpolation within a period.

It will be noted here that during a displacement of an amount equal to a signal period -1-, the total of four signals emitted gives four passages through zero, which makes it possible to reduce the measurement increment to one-quarter of the length -1- of a period by counting the said passages through zero.

This rough position and this fine position as well as their combination are obtained by means of the electronic processing circuit 3 from analog signals delivered by the two pairs of measurement capacitances.

For these purposes, the circuit 3 comprises, connected to the two pairs of measurement capacitors $CA_1-CA_2$ and $CB_1-CB_2$, two groups of switched reference capacitances $RA_1$ and $RA_2$ and $RB_1$ and $RB_2$ respectively, mounted in a bridge with the said measurement capacitances so as to form two similar, distinct capacitive bridges 4A and 4B one of which, 4A, is shown in FIG. 3. These reference capacitances, designated CR within each group in FIG. 3, are of MOS type as are their switches 11, and they are of binary order (1, 2, 4, 8 etc.).

The two outputs of each of these two capacitive bridges 4A and 4B are connected to a comparator 5A and 5B respectively whose output is connected to a processor 6 of CMOS type. This processor 6 has two feedback outputs 7 and 8 connected to the said capacitive bridges and a third output 9 connected to a digital display element 10.

The processor 6 has the characteristic function of assuring the switching of the reference capacitors of the two capacitive bridges 4A and 4B by a purely digital algorithm. The procedure applied is as follows:

The comparators 5A and 5B indicate to the processor 6 the direction of imbalance of the respective capacitive bridges 4A and 4B. The processor 6 reestablishes the balance of each of these two bridges by switching the reference capacitors CR in or out. The position of the switches 11 at that time gives the digital equivalent of the analog signal delivered by the amplitude C of the measurement capacitors $CA_1$, $CA_2$, $CB_1$ and $CB_2$ as defined previously and shown in FIG. 2.

As the reference capacitors are of binary order, the manner of balancing applied is conversion by successive approximations, similar to that used in analog-digital converters.

As the amplitude C of the said signal is related to the relative scale-slide position within each period, this method of balancing is equivalent to virtual displacements since, for the comparators 5A and 5B, no distinction can be made between actual movement and the approximation process.

Figure 4:
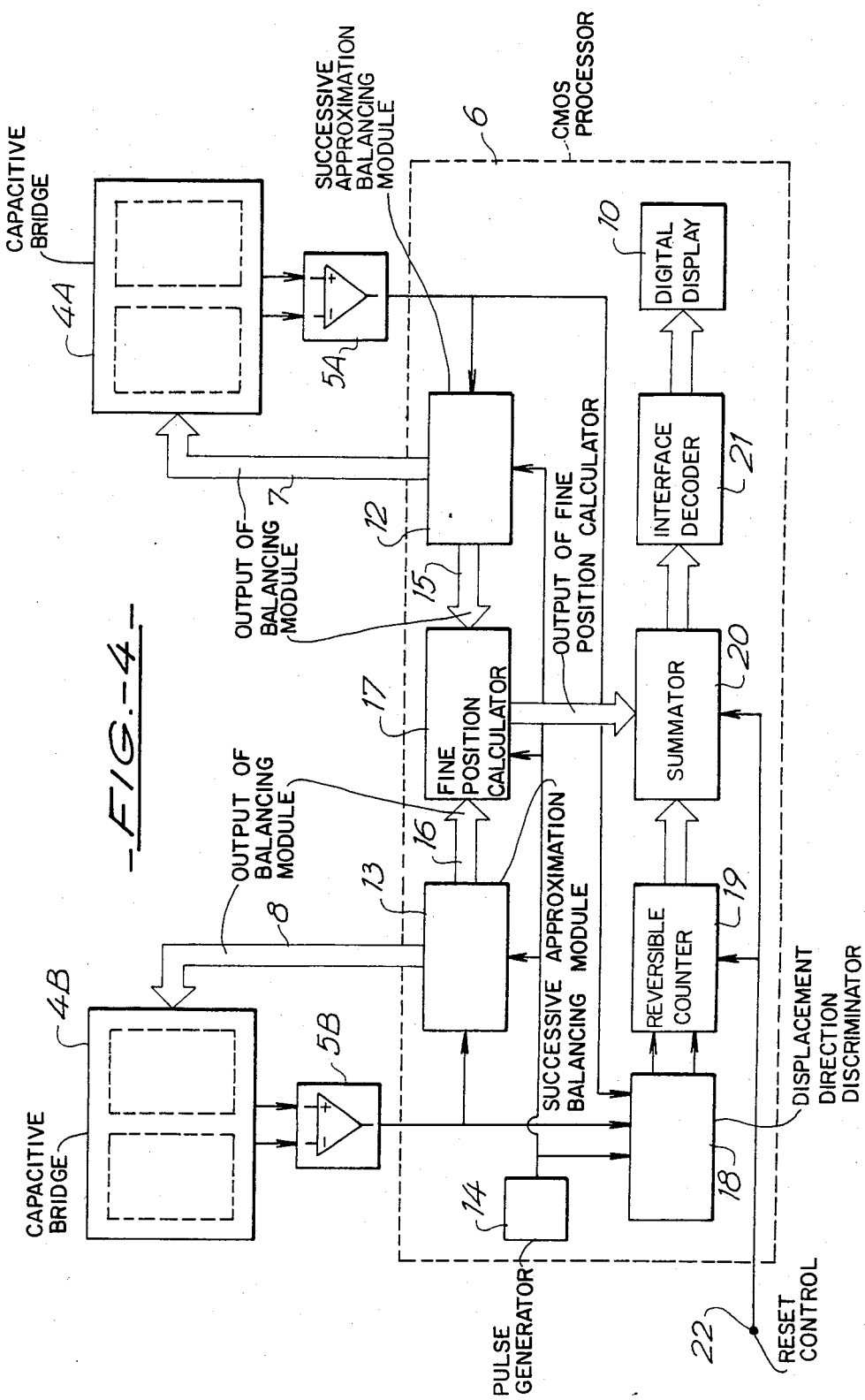
FIG. 4 is a block diagram illustrating the method of processing the signals produced.

This characteristic switching function of the reference capacitances by means of a digital algorithm constitutes the fine measurement by digital interpolation within each period of the periodic signals coming from the measurement capacitances $CA_1$, $CA_2$, $CB_1$ and $CB_2$ during the relative displacement of the scale and slide of the measurement device. This function, as well as the other count-up/count-down functions of the periods constituting the rough measurement and the combination of these two measurement components are illustrated by the block diagram of FIG. 4.

In this block diagram, the connections and the elements already mentioned bear the same reference numbers.

The processor 6 has successive approximation balancing modules 12 and 13, respectively connected to each of the two capacitive bridges 4A and 4B by the connections 7 and 8, respectively these modules receiving the output signals from their associated comparators 5A and 5B respectively as well as periodic interrupt pulses coming from an autonomous pulse generator 14.

These two balancing modules 12 and 13 are connected by a second output 15 and 16 respectively to a fine-position calculator 17 which furthermore also receives the periodic interrupt signal coming from the pulse generator 14.

In this first part of the circuit of the processor 6 which is intended for the determination of the fine measurement by the calculator 17, the periodic interrupt pulses have the function of interrupting, upon each pulse, the process of successive approximations, both to permit the reestablishing of balance of the capacitive bridges 4A and 4B and to avoid losing the rough measurement by counting as well as in order to determine by discrimination the direction of the relative scale-slide displacement.

In order to effect the rough measurement, the processor 6 comprises, connected to the output of each of the two comparators 5A and 5B as well as to the pulse generator 14, a discriminator 18 for the direction of displacement, which is acted on by the 90° phase shift of the signals coming from the two pairs of measurement capacitances as well as a reversible counter 19 which is acted on by the passages through zero of the signals coming from the said measurement capacitances, and is connected to the said discriminator 18.

The fine measurement and the rough measurement of the displacement which are thus determined are then combined by a summator 20 which is connected to the output of the fine position calculator 17 to the output of the reversible counter 19 and the output of which is connected to the digital display element 10 via an interface decoder 21.

The reversible counter 19 and the summator 20 of this circuit are connected to an external resetting control 22.

The degree of resolution and the precision of the capacitive measurement device of the invention obviously depend on the size of the increment used for the counting, the symmetry of its distribution and the fineness of the interpolation effected within each period of the measurement signals, as in all known capacitive measuring devices which operate on basis of counting and interpolation.

The digital interpolation effected here by the piloting of the switches of the reference capacitances CR of the capacitive bridges 4A and 4B by the processor 6 in accordance with a digital algorithm is competitive in view of the fact that the capacitance ratios may be defined very precisely as a result of the CMOS technology used.

When greater precision is desired, it is advantageous to effect this interpretation by means of the circuit shown in FIG. 5, which is in fact a first variant of the capacitive bridge shown in FIG. 3.

This first variant has the advantage of simulating an integrated circuit with switched reference capacitances. This bridge circuit consists of two inversion integrators with switched reference capacitances with digitally controlled gain.

In this circuit, the switches 11 of the reference capacitances CR of the two groups $RA_1$ and $RA_2$ are connected in such a manner that all switching is effected between a potential controlled by a low-impedance source consisting of the output of an operational amplifier 23 and 24 respectively, integrated in the circuit of the said capacitances, and a virtual ground formed by the input of the said amplifier.

In these two integrators, the resistance is simulated by the combination of a measurement capacitance $CA_1$, $CA_2$ and of a switch 25 or 26 respectively.

These two switches 25 and 26 are actuated by the aforementioned digital signal generator and they switch between a low-impedance source 29 fed by the digital signal generator which also has already been mentioned and the virtual ground of the amplifiers 23 and 24.

The two outputs of this bridge circuit are connected to the comparator 5A in the same manner and for the same purpose as described previously.

Of course, in this first variant a second identical bridge circuit is connected to the second pair of measurement capacitances $RB_1$ and $RB_2$ and to the comparator 5B and on the inside of each group of reference capacitances of these two bridge circuits they are piloted also, in the same manner as described previously, by the processor 6.

This first variant produces the desired effect of greater precision by the elimination of parasitic disturbances. As a matter of fact, as the switchings are effected between ground potential, virtual ground potential and the potential of the output of a low-impedance source, capacitive leaks of the analog switches are eliminated. Furthermore, as the measurement capacitances $CA_1$ and $CA_2$ are at the same potential, there is no capacitive coupling between their electrodes nor the creation of parasitic disturbances, which furthermore simplifies their shielding as well as the shielding of the electronic circuit.

It is possible further to increase the sensitivity of the device.

Figure 6:
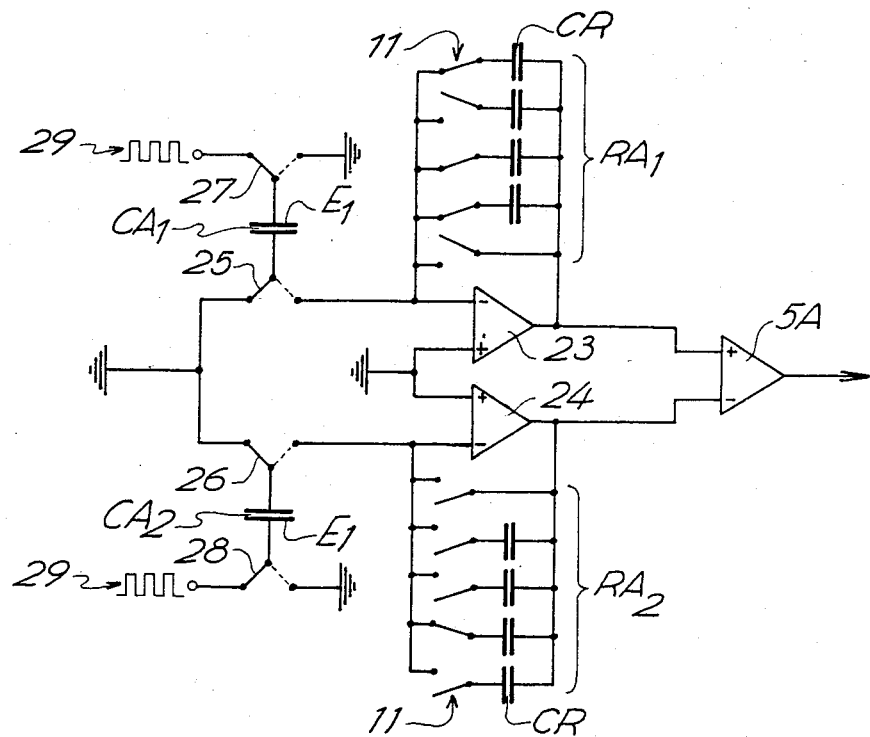

The second variant shown in the diagram of FIG. 6 is intended for this purpose.

In this second variant, the electrodes $E_1$ of the scale are connected alternatively by means of switches 27, 28 to ground or to a low-impedance source 29 fed by the digital signal generator. The measurement capacitances $CA_1$ and $CA_2$ are in this case also mounted in a capacitive bridge of the same nature as that of the first variant which has been described above and shown in FIG. 5 and which, it may be recalled, consists of two inversion integrators with switched reference capacitances.

The switches 27 and 28 are in this case also controlled by the digital signal generator like the switches 25 and 26 and in synchronism with the latter.

Each of the switches 25 and 26 thus switches between ground and the virtual ground of an operational amplifier 23, 24 while the switches 27 and 28 switch between the low-impedance source 29 and ground. In this way all the parasitic capacitances to ground due to the switches are eliminated and the gain in sensitivity which results therefrom permits the measurement of capacitances of a value of less than 0.1 pF.

It will be understood that other variants of the capacitive bridges 4A and 4B can be applied without thereby going beyond the scope of the invention, provided that one always compares measurement capacitances with reference capacitances.

With respect to the electrodes, it is also understood that any variant in their arrangement which makes it possible to create two pairs of measurement capacitances capable of generating signals the variation of which is significant both of the amplitude and of the direction of the displacements between slide and scale can be applied without thereby going beyond the scope of the invention.

Figure 7:
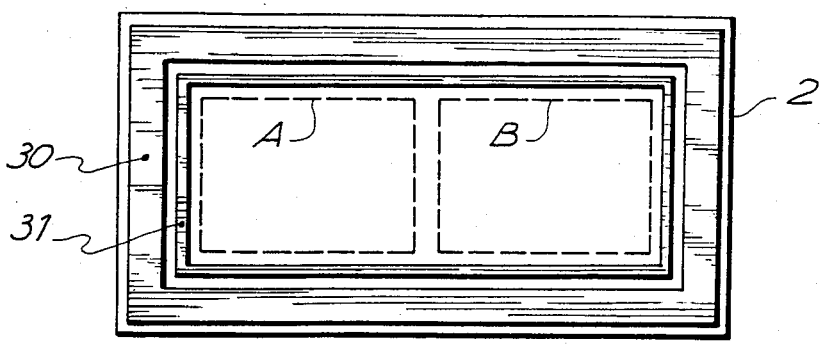

An example of a different arrangement of electrodes is given in the third variant shown in FIG. 7.

In this third variant, the diagrammatic showing of which is limited to what is useful for understanding, the slide 2 contains, in addition to the two groups of electrodes A and B (shown in detail in FIG. 1), an electrode 30 which may be either a feed or a ground electrode, electrically insulated from said two groups by an insulation electrode 31 arranged in intermediate position, these two additional electrodes surrounding the two groups A and B in question.

On their part the electrodes $E_1$ of the scale, not shown, are individual and floating, that is to say entirely insulated electrically from each other as well as from the scale. In this way, these electrodes $E_1$ of the scale operate only as signal transfer electrodes. This arrangement has the advantage of not requiring electrical contact between the slide and the scale, as in the case of the embodiment shown in FIG. 1.

In this third variant, the same effect can be obtained by a plurality feed or ground electrodes 30 each insulated from the two groups of electrodes A and B.

Another example of a different arrangement of electrodes (not shown) may be formed by the interpenetration, in the manner of the teeth of two combs, of the electrodes $A_1$-$A_2$ and $B_1$-$B_2$ respectively of the two pairs of electrodes of the slide. This arrangement facilitates compliance with the symmetrical configuration of the electrodes and their phase shift.

Finally, conversion by successive approximation can be replaced by other algorithms such as, for instance, conversion by iteration.

What is claimed is:

1. A capacitive device for the measurement of the relative displacement of the scale and the slide of a length or angle measuring instrument in which the scale and the slide are provided with series of electrodes aligned in the direction of their relative displacement and arranged and electrically fed in such a manner as to form, by their combination, a plurality of electric capacitances adapted to produce a periodic signal the number of periods of which is proportional to this displacement and in which the electrodes of the slide are connected to an electronic processing circuit adapted to produce a digital end-of-measurement signal of this displacement by counting the number of these periods and interpolating within each of them, characterized by the fact that the electrodes ($E_1$) of the scale (1) are spaced uniformly apart in the direction of its length, by the fact that at least a part of the electrodes of the slide (2) are distributed in two groups (A, B), each comprising at least one pair of electrodes ($A_1$-$B_1$, $A_2$-$B_2$) in which the two electrodes are insulated from each other, arranged above the region of the electrodes ($E_1$) of the scale and fed by a digital signal generator, these two electrodes being furthermore 180° out of phase and the two electrode groups being 90° out of phase, so as to form, by their association with the electrodes ($E_1$) of the scale, two pairs of capacitances for measurement against ground ($CA_1$-$CA_2$, $CB_1$-$CB_2$) the change in the signals of which is significant of the amplitude and direction of said displacement, by the fact that the electronic processing circuit (3) comprises two switched reference capacitance groups of MOS type ($RA_1$-$RA_2$, $RB_1$-$RB_2$) of binary order-connected in a bridge with the measurement capacitances so as to form two capacitive bridges (4A, 4B), two comparators (5A, 5B) each connected to one of these two bridges, and a processor (6) of CMOS type having two inputs connected to these two comparators and two feedback outputs (7, 8) connected to the two capacitive bridges and the circuit of which comprises modules (12, 13) adapted to effect a digital interpolation within each period, periodically reestablishing, under control by the digital signal generator, the balance of the capacitive bridges by switching of the reference capacitances (CR), the position of the switches (11) of these capacitances giving upon each balancing the digital equivalent of the displacement, the counting of the periods being possibly furthermore effected between these balancing operations by the intervention of a pulse generator.

2. A device according to claim 1, characterized by the fact that the electrodes ($E_1$—FIG. 1, FIG. 3, FIG. 5) of the scale are all connected to ground.

3. A device according to claim 1, characterized by the fact that the electrodes ($E_1$—FIG. 6) of the scale are all connected alternatively to ground and to a low-impedance source (29) fed by the digital signal generator, by two switches (27, 28) actuated by the digital signal generator.

4. A device according to claim 1, characterized by the fact that each of the two capacitive bridges (4A, 4B) is formed of two operational amplifiers (23, 24) connected as inversion integrators with switched capacitances in which the resistance is simulated by the combination of a measurement capacitance ($CA_1$, $CA_2$) and a switch (25, 26) actuated by the digital signal generator, the reference capacitances (CR) being connected in the feedback loop of these integrators in such a manner as by their action to define a gain which is digitally controlled by the switches (11) of the said reference capacitances (FIG. 5, FIG. 6).

5. A device according to claim 4, wherein the electrodes ($E_1$) of the scale are all connected to ground, and wherein the two switches (25, 26, FIG. 5) of the two integrators are mounted in such a manner as to switch between a low-impedance source (29) fed by the digital signal generator and virtual ground of the operational amplifiers (23, 24).

6. A device according to claim 4, wherein the electrodes ($E_1$—FIG. 6) of the scale are all connected alternatively to ground and to a low-impedance source (29) fed by the digital signal generator by two switches (27,28) actuated by the digital signal generator, and wherein the two switches (25,26, FIG. 6) of the two integrators are mounted in such a manner as to switch between ground and the virtual ground of the optional amplifiers (23, 24) these two switches being actuated in synchronism with the switches (27, 28) connecting the electrodes of the scale alternatively to the ground and to the low-impedance source (29).

7. A device according to claim 1, characterized by the fact that the electrodes ($E_1$—FIG. 7) of the scale are individual and floating, while the slide (2) has, in addition to its two groups of electrodes (A, B), at least one feed or ground electrode (30) insulated from these two groups.

8. A device according to claim 2, characterized by the fact that the two switches (25, 26, FIG. 5) of the two integrators are mounted in such a manner as to switch between a low-impedance source (29) fed by the digital signal generator and virtual ground of the operational amplifiers (23, 24).

9. A device according to claim 4, characterized by the fact that the two switches (25, 26, FIG. 5) of the two integrators are mounted in such a manner as to switch between a low-impedance source (29) fed by the digital signal generator and virtual ground of the operational amplifiers (23, 24).

10. A device according to claim 3, characterized by the fact that the two switches (25, 26, FIG. 6) of the two integrators are mounted in such a manner as to switch between ground and the virtual ground of the operational amplifiers (23, 24), these two switches being actuated in synchronism with the switches (27, 28) connecting the electrodes of the scale alternatively to the ground and to the low-impedance source (29).

11. A device according to claim 4, characterized by the fact that the two switches (25, 26, FIG. 6) of the two integrators are mounted in such a manner as to switch between ground and the virtual ground of the operational amplifiers (23, 24), these two switches being actuated in synchronism with the switches (27, 28) connecting the electrodes of the scale alternatively to the ground and to the low-impedance source (29).

* * * * *